United States Patent [19]

Pinch et al.

[11] Patent Number: 4,772,488

[45] Date of Patent: Sep. 20, 1988

[54] ORGANIC BINDER REMOVAL USING $CO_2$ PLASMA

[75] Inventors: Harry L. Pinch, Princeton; Barry J. Thaler, Lawrenceville, both of N.J.

[73] Assignee: General Electric Company, Schenectady, N.Y.

[21] Appl. No.: 29,112

[22] Filed: Mar. 23, 1987

[51] Int. Cl.$^4$ .......................... B05D 3/06; B05D 5/12; B05D 3/02; B05D 21/306

[52] U.S. Cl. ......................................... 427/39; 427/96; 427/376.2; 427/376.3; 156/643

[58] Field of Search ..................... 427/38, 39, 41, 96, 427/376.3, 376.1; 156/643

[56] References Cited

U.S. PATENT DOCUMENTS 4,619,836 10/1986 Prabhu et al. .................... 427/41

*Primary Examiner*—Norman Morgenstern
*Assistant Examiner*—Margaret Burke
*Attorney, Agent, or Firm*—Henry I. Steckler; James C. Davis, Jr.; Paul R. Webb, II

[57] ABSTRACT

An improved method of fabricating thick film dielectrics and copper conductors comprises depositing and drying an appropriate thick-film ink, treating the resulting patterned layer with a carbon dioxide plasma until substantially all of the organic vehicle is removed therefrom and then firing the layer in an inert atmosphere. In an alternate embodiment, a dried dielectric ink is initially treated with an oxygen plasma until about 75 to 99 percent of the vehicle is removed. Multilayer copper-based circuit structure fabricated utilizing the subject method are characterized by excellent integrity of the dielectric layers.

6 Claims, No Drawings

ORGANIC BINDER REMOVAL USING $CO_2$ PLASMA

This invention relates to an improved method fabricating multilayer circuit structures, particularly those based on copper conductors.

BACKGROUND OF THE INVENTION

The use of specialized ink formulations to form thick films having various functions on suitable substrates in the construction of multilayer circuit structures is known in the art. Such technology is of increasing interest in the production of very dense multilayer circuit patterns on various substrates for a wide variety of applications in the electronics industry.

Of the conductive metals, gold and copper are of principal interest for the formation of conductive patterns from inks. Copper, of course, is more attractive because it has about the same conductivity as gold but is considerably cheaper. However, there are some problems with the fabrication of conductive lines from copper-based inks. Typically, an ink is comprised of finely divided copper having a particle size of from about 1 to 5 micrometers, a suitable glass frit, also reduced to a fine particle size, and an organic vehicle.

One of the major problems encountered in the fabrication of copper components concerns the removal of the organic vehicle prior to fusing the glass frit at high temperature. Incomplete removal of the organic vehicle will result in organic material being trapped in the fused glass frit. This trapped material, which can decompose into carbonaceous material, can cause changes in the electrical properties of the copper conductor thick film such that a device containing it will be subject to shorts, nonuniform conductivity and the like. Refiring of the copper-containing patterned layers can also decompose remaining organic material into gases which produce bubbles or voids in the final structure. These can likewise cause shorts and are particularly disadvantageous in multilayer structures as they can cause separation of the layers. Further, the presence of bubbles or voids, which can lead to low resistance paths, is disadvantageous in dielectric layers where it is necessary to maintain high resistance.

Were it not for the fact that copper is a readily oxidizable material, all of the organic material could be removed, for example, by simply heating the copper layer to 400°-500° C. in an oxidizing atmosphere. The copper, however, oxidizes at the same time and the degree of oxidation makes it extremely difficult to maintain the quality of the final product. The formation of copper oxide adversely affects the conductivity of the copper structure, the solderability of the fired thick film components and the sintering of the copper particles during the final firing step.

The inevitable presence of some copper oxide on the surface of a copper conductor adversely affects the integrity of an overlying insulator layer. As an overlying insulator layer is fused at high temperature in an inert atmosphere, copper oxide on the surface of the underlying copper conductor will decompose to reform copper and evolve oxygen. This process will, of course, continue as more layers and firings are added to the structure. The evolved oxygen causes loss of integrity of the overlying dielectric layer which is manifest as blistering and peeling of subsequently applied layers and porosity in the dielectric layers which can lead to a reduction in resistance by facilitating copper migration into the dielectric. All of this has a significant adverse effect on the performance of the structure as high dielectric integrity is necessary for good device performance.

In order to reduce the effects caused by firing in an oxidizing atmosphere, it has been suggested to fire thick film inks, particularly copper conductor inks, in nonoxidizing atmospheres, such as nitrogen, to limit the oxidation of the other materials in the ink. The use of a nonoxidizing atmosphere, in addition to being more expensive than oxidizing atmospheres, is not completely satisfactory in that considerable amounts of the organic materials are thermally decomposed to carbonaceous products which remain in the dried layer and can cause shorts and the like, as discussed above.

In Prabhu et al., U.S. Pat. No. 4,619,836, issued Oct. 28, 1986, it is disclosed that the organic vehicle can be removed from a thick film ink prior to firing by treating the dried ink with a suitable plasma, i.e., an oxidizing or reducing plasma. Copper inks are specifically mentioned. It has now been found that, although effective, this method may produce an intolerably high degree of oxidation of the copper conductor in the copper layer if carried out for a time sufficient to assure complete removal of the organic materials therefrom.

In accordance with this invention, a method has been found to plasma treat layers of thick film inks which effectively removes organic materials therefrom without any of above-named disadvantages.

SUMMARY OF THE INVENTION

Copper-containing thick film electrical structures are fabricated by depositing and drying copper and dielectric thick-film inks on a suitable substrate, treating the dried inks with a carbon dioxide plasma for a time sufficient to remove the organic vehicle therefrom, and fusing the resulting layers at high temperatures in an inert atmosphere. A dried dielectric ink can be initially treated with an oxygen plasma until at least about 75 percent of the organic vehicle has been removed. The plasma is then changed to carbon dioxide and removal of the vehicle is completed.

DETAILED DESCRIPTION OF THE INVENTION

The plasma treatment of this invention is applicable to both dielectric and copper conductor inks. These inks are typically comprised of a glass frit and an organic vehicle. The copper inks additionally contain copper particles which are generally pure copper and have a particle size of from about 1 to 10, suitably from about 1 to 5, micrometers. The ink will contain from about 50 to about 90, suitably from about 65 to about 85, percent by weight of the copper particles.

The subject method may be utilized with commercially available copper conductor inks. It is generally not of significant advantage with commercial dielectric inks, however, since they generally contain oxidizing aids, such as barium nitrate and cobalt oxide, which create a porosity in the dielectric layers that cannot be prevented by the subject plasma treatment. The subject plasma treatment is highly advantageous with improved dielectric inks which do not require such oxidizing aids. Such improved dielectric inks are disclosed, for example, in Hang et al., U.S. patent application Ser. Nos. 914,301 and 914,302, filed Oct. 2, 1986, the disclosure of which is incorporated herein by reference.

The glass frit of the inks treated in accordance with this invention should be chemically compatible with copper or other conductor, if present, and the substrate as well as other materials utilized to prepare a multilayer circuit structure. In addition to chemical compatibility, the glass frit should also have a coefficient of expansion close to that of the substrate and the dielectric material being utilized. The glass frit should also have a glass transition temperature substantially higher than the thermal decomposition of the vehicle, suitably between about 700° and 1000° C. Finally, the glass frit should be reduced to a fine particle size, typically from about 3 to 5 micrometers. As a result thereof, copper particles, if present, can be uniformly distributed throughout the ink with good particle packing. Particularly preferred glass frits are zinc-calcium-aluminum-silicate and zinc-magnesium-barium-aluminum-zirconium-phosphosilicate frits disclosed in Prabhu et al., U.S. patent pplication Ser. No. 914,303, filed Oct. 2, 1986, the disclosure of which is incorporated herein by reference. The organic vehicle is typically a solution of one or more resin binders in one or more suitable solvents. The resin binders can be cellulose derivatives, such as methyl cellulose or ethyl cellulose, synthetic resins, such as polymethacrylates, polyesters, polyolefins, and the like. A particularly suitable binder is poly(isobutylmethacrylate). Conventional solvents include, for example, pine oil, terpineol, butyl carbitol acetate, 2,2,4-trimethyl-1,3-pentanediol monoisobutyrate, available from Texas Eastman Company under the trademark Texanol, and the like. The vehicles typically contain from about 5 to about 25 percent by weight of the binder component.

The vehicles may conventionally contain a viscosity modifier, e.g., a castor oil derivative available from N. L. Industries under the trademark Thixatrol, one or more surfactants in conventional amounts and a wetting agent of the type conventionally utilized in such inks to aid in coating the copper particles with the organic vehicle. The vehicle may contain up to about 25, preferably from about 10 to about 20, percent by weight of the wetting agent. A typical wetting agent is a dispersion of a complex multifunctional, aliphatic hydrocarbon in an aliphatic hydrocarbon oil available from Central Compounding Company, Chicago, Ill. under the trademark Hypothiolate 100. The components of the vehicle, if not readily volatized during drying of the ink, should have a thermal decomposition temperature no higher than about 400° C.

The inks are applied to a suitable substrate by conventional means, e.g., screen printing, brushing, spraying, release tape and the like. Suitable substrates include conventional materials such as silicon dioxide, alumina, porcelain-coated metal circuit boards and the like. The term "substrate" also includes layers of conventional dielectric material, copper conductor and copper via fill as would be the case in the fabrication of a conventional complex, multilayer copper-based circuit.

After the ink is applied to a suitable substrate, it is dried in air at about 100°-125° C. for 10-15 minutes to remove the majority of the vehicle. It is then treated with a plasma in accordance with this invention. The plasma treatment is carried out at a temperature below the thermal decomposition temperature of the components of the organic vehicle and, preferably, at between about 100° and 200° C.

It has been found that substantially all of the organic material in a copper ink can be removed without oxidizing the copper to a undesirable extent by treating the dried ink in a carbon dioxide plasma. While carbon dioxide is not considered an oxidizing plasma, it is probable that ionic oxygen species exist in the plasma, but not to an extent that would produce an undesirable degree of oxidation of the copper particles in the time required to remove substantially all of the organic material from the ink. Therefore, treatment of the dried copper ink with a carbon dioxide plasma in accordance with this invention effectively removes substantially all of the organic material therefrom without significant oxidation of the copper particles in the dried ink.

Treatment of a dried dielectric ink overlying a layer of copper conductor with an oxygen plasma will produce copper oxide on the surface of the conductor layer as a result of the active species of the plasma penetrating the porous dielectric layer. The formation of the copper oxide adversely affects the integrity of the dielectric layer as discussed above. Therefore, in order to maintain the integrity of the dielectric layers, it is necessary that it also be treated with a carbon dioxide plasma in accordance with this invention. However, it has been found that the time required to treat the dielectric layer can be materially reduced by using a two-step sequential plasma treatment of oxygen followed by carbon dioxide.

In the two-step procedure, treatment of the dried ink is carried out in an oxygen plasma until from about 75 to about 99 percent of the vehicle has been removed. It must be borne in mind that a considerable portion of the vehicle is removed during the initial drying step. The amount of vehicle remaining could readily be determined by conventional methods, such as weighing the substrate and the like. For a given ink, the temperature at which the glass frit begins to soften and densify will determine the point at which the plasma treatment is changed from oxygen to carbon dioxide. This is so because the amount of vehicle removed, as a function of time, is related to the formation of copper oxide on an underlying conductor. Therefore, there is a relationship between the softening temperature of the frit and the amount of vehicle removed when the plasma is changed.

In general, the lower the softening temperature of the glass frit in an ink, the lower the allowable amount of copper oxide that may be formed on an underlying conductor. An ink having a low softening temperature permits less copper oxide to be formed since there is less opportunity for the oxygen formed by decomposition of the copper oxide to escape through the dielectric layer before the temperature gets sufficiently high to cause the glass frit to flow and densify. Therefore, an ink with a low softening temperature, e.g. about 650° C., would be treated with the oxygen plasma until only about 75 to 80 percent of the vehicle was removed. Conversely, an ink with a high softening temperature, e.g., about 900° C., could be treated with the oxygen plasma until about 99 percent of the vehicle is removed. In general, the treatment with the oxygen plasma should not exceed about 10 minutes utilizing conventional conditions.

The plasma utilized to treat dried dielectric and functional inks, such as copper conductors, in accordance with this invention can be generated utilizing reactors of conventional design. The specific conditions of the plasma can vary within a relatively wide range. In general, from about 10 to 100 watts of power are utilized to generate the plasma. The pressure in the reactor is generally from about 0.5 to 3 Torr, the temperature is from about 20° to 250° C. and the gas flow of carbon dioxide is from about 30 to 300 sccm. Typically, at least about 15, preferably from about 30 to 120, minutes are necessary to ensure substantially complete removal of the organic materials from the dried ink. The conditions for the oxygen plasma in the sequential treatment are essentially similar. Substantial removal of the organic material from the dried ink can be determined conventionally by monitoring indicators such as weight loss from the substrate, specific reaction products in the effluent gases of the reaction chamber and the like.

After the plasma treatment of this invention is carried out, the substrate containing the ink pattern is withdrawn from the plasma chamber and fired at an elevated temperature above the decomposition temperature of the organic materials and at least equal to the glass transition temperature of the glass frit, suitably from about 850° to about 950° C. The substrate is fired for a time sufficient to fuse the particles of the glass frit. In a multilayer circuit structure based on copper, all layers, including dielectric layers due to their porosity, are suitably fired in an inert ambient, such as nitrogen, to prevent oxidation of the copper conductor.

The resulting fired thick-film ink is densely packed without voids and has an exceptionally smooth surface. Since the fused layer is free of residual organic material, it remains intact through the subsequent firings necessary to construct a multilayer circuit without the formation of gas bubbles and layer separation heretofore experienced with structures containing such material. The integrity of dielectric layers treated in accordance with this invention remains substantially intact in comparison to similar structures which had undergone no plasma treatment or treatment with an oxygen plasma.

The invention has been described with reference to preferred embodiments thereof. It will be appreciated by those skilled in the art that various modifications may be made from the specific details given without departing from the spirit and scope of the invention.

What is claimed is:

1. In a method of fabricating a thick-film dielectric structure free of residual organic material on a substrate including a copper conductor in contact with the dielectric structure comprising:
   (a) depositing on the substrate a pattern of a thick film dielectric ink comprising a suitable glass frit and an organic vehicle;
   (b) drying the ink to form a patterned layer;
   (c) treating the layer with a plasma at a temperature below the thermal decomposition temperature of the organic vehicle for a time sufficient to substantially selectively remove the organic vehicle from the layer while minimally oxidizing the copper conductor; and
   (d) firing the layer at or above the glass transition temperature of the glass frit in an inert atmosphere until the glass frit fuses, the improvement wherein the plasma is a carbon dioxide plasma.

2. A method in accordance with claim 1, wherein the plasma treatment is carried out at a temperature of from about 100° to 200° C.

3. A method in accordance with claim 1, wherein the plasma-treated layer is fired at a temperature of from about 850° to about 950° C.

4. A method in accordance with claim 1, wherein the layer is fired in nitrogen.

5. A method in accordance with claim 1, wherein, prior to treatment with the carbon dioxide plasma, the dried ink is treated with an oxygen plasma for a time sufficient to remove from about 75 to about 99 percent by weight of the organic vehicle.

6. In a method of fabricating a thick film copper conductor on a substrate comprising:
   (a) depositing on the substrate a pattern of a thick film ink comprising a suitable glass frit, copper particles and an organic vehicle;
   (b) drying the ink to form a patterned layer;
   (c) treating the layer with a plasma at a temperature below the thermal decomposition temperature of the organic vehicle for a time sufficient to substantially selectively remove the organic vehicle from the layer while minimally oxidizing the copper conductor; and
   (d) firing the layer at or above the glass transition temperature of the glass frit in an inert atmosphere until the glass frit fuses, the improvement wherein the plasma is a carbon dioxide plasma.

* * * * *